United States Patent
Chen et al.

(10) Patent No.: US 8,987,096 B2
(45) Date of Patent: Mar. 24, 2015

(54) SEMICONDUCTOR PROCESS

(75) Inventors: Ying-Tsung Chen, Kaohsiung (TW);
Chien-Ting Lin, Hsinchu (TW); Ssu-I Fu, Kaohsiung (TW); Shih-Hung Tsai, Tainan (TW); Wen-Tai Chiang, Tainan (TW); Chih-Wei Chen, Taichung (TW); Chiu-Hsien Yeh, Tainan (TW); Shao-Wei Wang, Taichung (TW); Kai-Ping Wang, Tainan (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/367,376

(22) Filed: Feb. 7, 2012

(65) Prior Publication Data
US 2013/0203230 A1    Aug. 8, 2013

(51) Int. Cl.
H01L 21/336 (2006.01)
H01L 21/28 (2006.01)
H01L 29/66 (2006.01)
H01L 29/78 (2006.01)
H01L 29/51 (2006.01)

(52) U.S. Cl.
CPC .... *H01L 29/66477* (2013.01); *H01L 21/28185* (2013.01); *H01L 29/51* (2013.01); *H01L 29/513* (2013.01); *H01L 29/66545* (2013.01); *H01L 29/7833* (2013.01)
USPC .................................. 438/287; 257/E21.409

(58) Field of Classification Search
CPC .................. H01L 29/66477; H01L 21/28185; H01L 29/51
USPC .......................................... 438/287, 183–185
See application file for complete search history.

(56) References Cited

U.S. PATENT DOCUMENTS

| | | |
|---|---|---|
| 5,498,768 A | 3/1996 | Nishitani |
| 6,063,698 A | 5/2000 | Tseng |
| 6,251,761 B1 | 6/2001 | Rodder |
| 6,372,581 B1 * | 4/2002 | Bensahel et al. ............... 438/287 |
| 6,380,104 B1 | 4/2002 | Yu |
| 6,451,660 B1 * | 9/2002 | Ma et al. ........................ 438/343 |
| 6,492,217 B1 | 12/2002 | Bai |
| 6,642,066 B1 | 11/2003 | Halliyal |
| 6,656,852 B2 | 12/2003 | Rotondaro |
| 6,696,345 B2 | 2/2004 | Chau |
| 6,818,517 B1 | 11/2004 | Maes |
| 6,818,553 B1 | 11/2004 | Yu |
| 6,841,484 B2 | 1/2005 | Ying |
| 6,855,607 B2 | 2/2005 | Achuthan |
| 6,921,711 B2 | 7/2005 | Cabral, Jr. |
| 7,012,027 B2 | 3/2006 | Perng |
| 7,013,446 B2 | 3/2006 | Ohba |
| 7,030,430 B2 | 4/2006 | Doczy |
| 7,074,680 B2 | 7/2006 | Doczy |
| 7,112,495 B2 | 9/2006 | Ko |
| 7,126,199 B2 | 10/2006 | Doczy |
| 7,135,361 B2 | 11/2006 | Visokay |
| 7,157,378 B2 | 1/2007 | Brask |
| 7,160,767 B2 | 1/2007 | Brask |

(Continued)

*Primary Examiner* — Kimberly Rizkallah
*Assistant Examiner* — Mounir Amer
(74) *Attorney, Agent, or Firm* — Winston Hsu; Scott Margo

(57) ABSTRACT

A semiconductor process includes the following steps. A substrate is provided. An ozone saturated deionized water process is performed to form an oxide layer on the substrate. A dielectric layer is formed on the oxide layer. A post dielectric annealing (PDA) process is performed on the dielectric layer and the oxide layer.

15 Claims, 6 Drawing Sheets

(56) References Cited

U.S. PATENT DOCUMENTS

| | | | |
|---|---|---|---|
| 7,208,366 B2 | 4/2007 | Tsai | |
| 7,250,654 B2* | 7/2007 | Chen et al. | 257/324 |
| 7,250,658 B2 | 7/2007 | Doris | |
| 7,371,649 B2 | 5/2008 | Cheng | |
| 7,381,608 B2 | 6/2008 | Brask | |
| 7,384,880 B2 | 6/2008 | Brask | |
| 7,488,656 B2 | 2/2009 | Cartier | |
| 7,501,336 B2 | 3/2009 | Doyle | |
| 7,521,324 B2 | 4/2009 | Ohmi | |
| 7,531,437 B2 | 5/2009 | Brask | |
| 7,592,270 B2 | 9/2009 | Teo | |
| 7,601,648 B2 | 10/2009 | Chua | |
| 7,745,309 B2* | 6/2010 | Thakur et al. | 438/458 |
| 7,824,990 B2 | 11/2010 | Chang | |
| 8,071,458 B1* | 12/2011 | Liu et al. | 438/393 |
| 2004/0007561 A1 | 1/2004 | Nallan | |
| 2005/0118836 A1* | 6/2005 | Chou et al. | 438/786 |
| 2005/0202624 A1 | 9/2005 | Li | |
| 2005/0275035 A1 | 12/2005 | Mathew | |
| 2006/0054943 A1 | 3/2006 | Li | |
| 2006/0094192 A1 | 5/2006 | Yang | |
| 2006/0172548 A1 | 8/2006 | Wu | |
| 2006/0211259 A1 | 9/2006 | Maes | |
| 2006/0284271 A1 | 12/2006 | Doyle | |
| 2007/0015365 A1 | 1/2007 | Chen | |
| 2007/0066041 A1* | 3/2007 | Tsao et al. | 438/592 |
| 2007/0072376 A1 | 3/2007 | Chen | |
| 2007/0218661 A1 | 9/2007 | Shroff | |
| 2008/0061366 A1 | 3/2008 | Liu | |
| 2008/0070395 A1 | 3/2008 | Yen | |
| 2008/0157231 A1 | 7/2008 | Wang | |
| 2009/0057759 A1 | 3/2009 | Obradovic | |
| 2009/0057787 A1 | 3/2009 | Matsuki | |
| 2009/0124097 A1 | 5/2009 | Cheng | |
| 2009/0179283 A1 | 7/2009 | Adams | |
| 2009/0200494 A1 | 8/2009 | Hatem | |
| 2010/0044783 A1 | 2/2010 | Chuang | |
| 2010/0048027 A1 | 2/2010 | Cheng | |
| 2010/0062592 A1 | 3/2010 | Clark | |
| 2010/0068877 A1 | 3/2010 | Yeh | |
| 2010/0075507 A1 | 3/2010 | Chang | |
| 2010/0081262 A1 | 4/2010 | Lim | |
| 2010/0129994 A1 | 5/2010 | Awad | |
| 2010/0184281 A1 | 7/2010 | Hsu | |
| 2010/0219481 A1* | 9/2010 | Tseng et al. | 257/369 |
| 2011/0256682 A1* | 10/2011 | Yu et al. | 438/287 |
| 2011/0260255 A1* | 10/2011 | Wang et al. | 257/368 |
| 2012/0025327 A1* | 2/2012 | Ji et al. | 257/411 |
| 2012/0322220 A1* | 12/2012 | Chen et al. | 438/381 |

* cited by examiner

SEMICONDUCTOR PROCESS

BACKGROUND OF THE INVENTION

1. Field of the Invention

The present invention relates generally to a semiconductor process, and more specifically to a semiconductor process, wherein an ozone saturated deionized water process is carried out to form an oxide layer and an annealing process is performed after a dielectric layer is formed.

2. Description of the Prior Art

Poly-silicon is conventionally used as a gate electrode in semiconductor devices such as metal-oxide-semiconductors (MOS). With the trend towards scaling down the size of semiconductor devices, conventional poly-silicon gates face such problems as lower performances due to boron penetration and unavoidable depletion effect, which enlarges the equivalent thickness of the gate dielectric layer, reduces the gate capacitance, and worsens the driving force of the devices. Therefore, work function metals that are suitable for use as the high-K gate dielectric layer are used to replace the conventional poly-silicon gate to be the control electrode.

Due to the material difference in a gate dielectric layer having a high dielectric constant and a substrate, a buffer layer will be deposited between both of them before the dielectric layer having a high dielectric constant is deposited on the substrate. The buffer layer may be an oxide layer, and may be formed by an in situ steam generation (ISSG) process. AS the size of semiconductor components are miniaturized, the effective oxide thickness (EOT) and the gate leakage (Jg) are difficult to minimize because of process limitations.

A semiconductor process that can reduce the effective oxide thickness (EOT) and the gate leakage (Jg), are extremely needed to reach the demand of semiconductor scaled down components.

SUMMARY OF THE INVENTION

The present invention provides a semiconductor process, which performs an ozone saturated deionized water process to form an oxide layer on the substrate; forms a dielectric layer on the oxide layer; and then performs an annealing process on the dielectric layer and the oxide layer. Thus, a semiconductor structure formed by the semiconductor process has a thinner effective oxide thickness and less gate leakage.

The present invention provides a semiconductor process including the following steps. A substrate is provided. An ozone saturated deionized water process is performed to form an oxide layer on the substrate. A dielectric layer is formed on the oxide layer. A post dielectric annealing (PDA) process is performed on the dielectric layer and the oxide layer.

According to the above, the present invention provides the semiconductor process which performs an ozone saturated deionized water process to form an oxide layer on the substrate; forms a dielectric layer on the oxide layer; and then performs an annealing process on the dielectric layer and the oxide layer. Therefore, the effective oxide thickness (EOT) and gate leakage (Jg) of the formed dielectric layer and oxide layer can be reduced by performing the ozone saturated deionized water process to form the oxide layer and performing a post dielectric annealing (PDA) process on the dielectric layer and the oxide layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
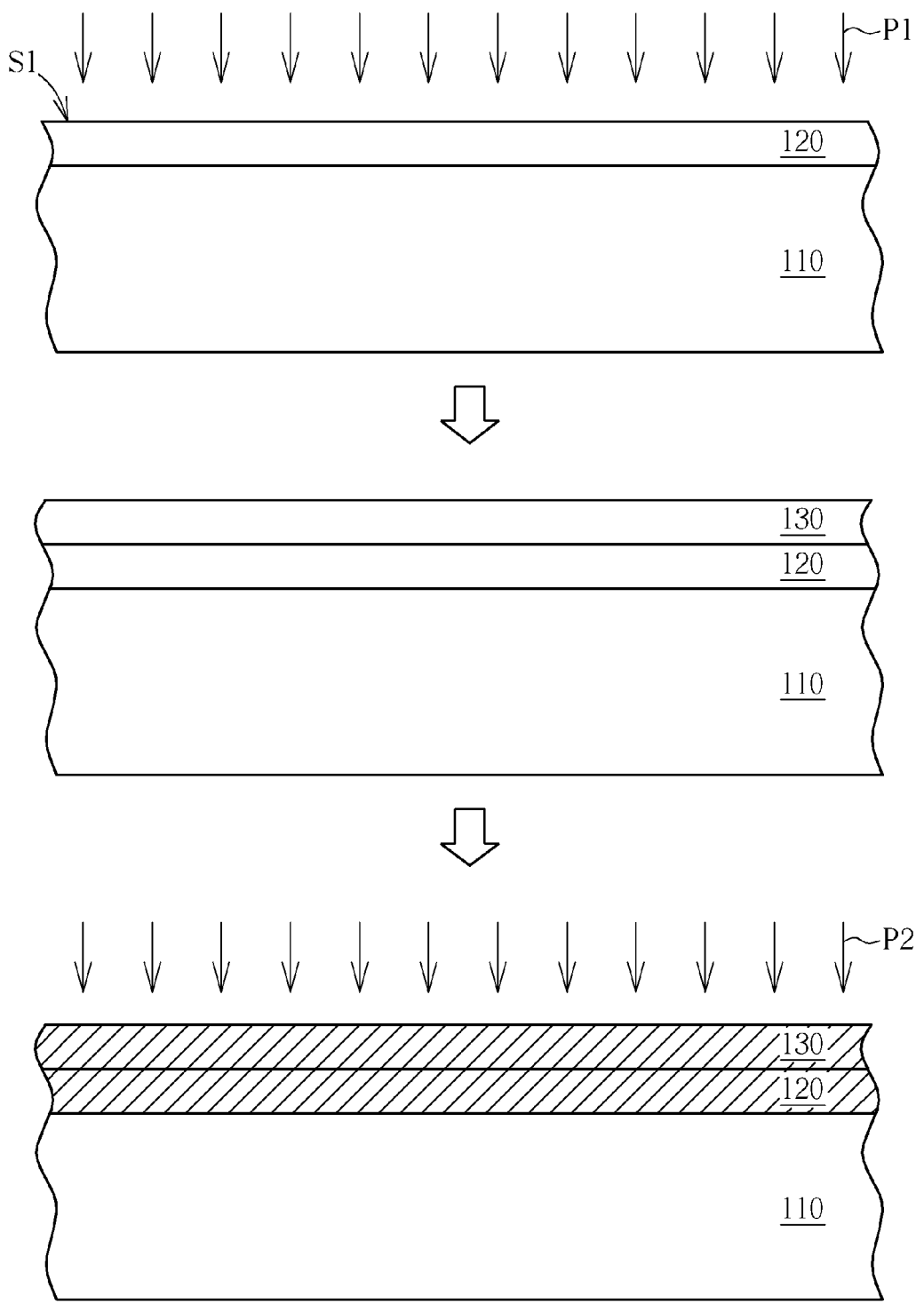
FIG. 1 schematically depicts a cross-sectional view of a semiconductor process according to one embodiment of the present invention.

FIG. 1 schematically depicts a cross-sectional view of a semiconductor process according to one embodiment of the present invention. As shown in the top part of FIG. 1, a substrate 110 is provided. The substrate 110 may be a semiconductor substrate such as a silicon substrate, a silicon containing substrate, a III-V group-on-silicon (such as GaN-on-silicon) substrate, a graphene-on-silicon substrate or a silicon-on-insulator (SOI) substrate. A pre-treatment process (not shown) may be selectively performed to clean impurities such as native oxides on the substrate 110. The pre-treatment process (not shown) may be a dilute hydrofluoric acid containing (DHF) pre-treatment process, but it is not limited thereto. An ozone saturated deionized water process P1 is performed to form an oxide layer 120 on the substrate 110. In the present invention, an oxide layer 120 can be formed on the substrate 110 by performing an ozone saturated deionized water process P1. However, an oxide layer 120 can not be formed on the substrate 110 by performing a pure ozone process. The oxide layer 120 formed by applying the ozone saturated deionized water process P1 has a thinner thickness, so that the effective oxide thickness (EOT) of the oxide layer 120 is lower. After the ozone saturated deionized water process P1 is performed, a standard clean 1 (SC1) process may be selectively performed to clean residues on the surface S1 of the oxide layer 120.

As shown in the middle part of FIG. 1, a dielectric layer 130 is formed on the oxide layer 120. If the dielectric layer 130 is a dielectric layer having a high dielectric constant, the oxide layer 120 can be a buffer layer for buffering difference between both materials. The dielectric layer 130 having a high dielectric constant may include hafnium oxide, zirconium oxide or etc. The dielectric layer 130 having a high dielectric constant may be the group selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalite ($SrBi_2Ta_2O_9$, SBT), lead zirconate titanate ($PbZr_xTi_{1-x}O_3$, PZT) and barium strontium titanate ($Ba_xSr_{1-x}TiO_3$, BST).

As shown in the bottom part of FIG. 1, a post dielectric annealing (PDA) process is performed on the dielectric layer 130 and the oxide layer 120. The post dielectric annealing (PDA) process P2 is beneficial for the denser structures of the dielectric layer 130 and the oxide layer 120. The defects in the dielectric layer 130 and the oxide layer 120 can being repaired, and silicate such as hafnium silicate ($HfSiO_2$) may be formed between the oxide layer 120 and the dielectric layer 130, therefore reducing the gate leakage (Jg) of the dielectric layer 130 and the oxide layer 120.

Figure 10:
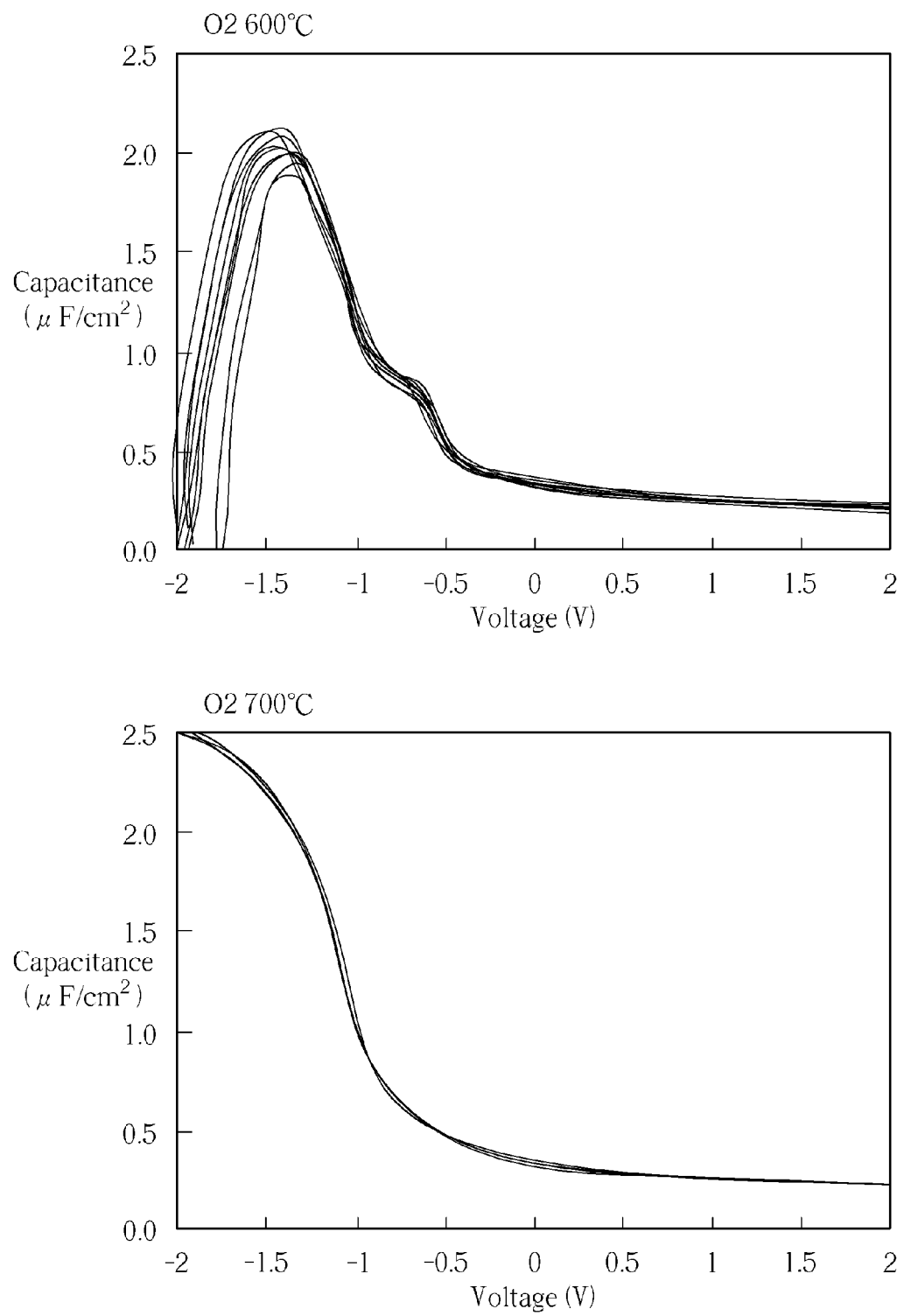
FIG. 10 schematically depicts capacitance versus voltage curves of a semiconductor process according to one embodiment of the present invention under the annealing temperature of 600° C. and 700° C.

The post dielectric annealing (PDA) process P2 may include an oxygen annealing process, an ammonia annealing process or a nitrogen annealing process etc. For example, the post dielectric annealing (PDA) process P2 may include performing an oxygen annealing process, an ammonia annealing process, or may be a two-stage process including performing a nitrogen annealing process after an oxygen annealing process and an ammonia annealing process, but it is not limited thereto. In a preferred embodiment, the post dielectric annealing (PDA) process P2 is an oxygen annealing process. Moreover, the annealing temperature of the post dielectric annealing (PDA) process P2 is preferred to be 600° C.~900° C. Still in a preferred embodiment, the annealing temperature of the post dielectric annealing (PDA) process P2 is preferentially 700° C., so that a formed semiconductor structure can have good electrical curves (described in the following). FIG. 10 schematically depicts capacitance versus voltage curves of a semiconductor process, according to one embodiment of the present invention under annealing temperatures of 600° C. and 700° C., wherein the top part schematically depicts the capacitance versus voltage curves of a semiconductor process under the annealing temperature of 600° C., and the bottom part schematically depicts the capacitance versus voltage curves of a semiconductor process under the annealing temperature of 700° C. As shown in the top part of FIG. 10, the capacitance corresponding to a voltage lower than −1.2 decreases and tends dangerously towards zero, the curves of the capacitance versus voltage are unstable, and a peak capacitance occurs for a voltage comprised between −1 and −0.5 Volts. The situation for the capacitance is not beneficial to form a semiconductor structure. As shown in the bottom part of FIG. 10, the curve of the capacitance versus voltage is smooth and complete. So, a semiconductor structure can show better electrical performances when the annealing temperature of the post dielectric annealing (PDA) process P2 approach 700° C.

The semiconductor process of the present invention can be applied to form various semiconductor components. It will be applied to form a transistor below, paired with gate-last for high-k last, buffer layer last process, but it is not limited thereto. The semiconductor process of the present invention can also be applied to other gate-last processes or gate first processes.

Figure 2:
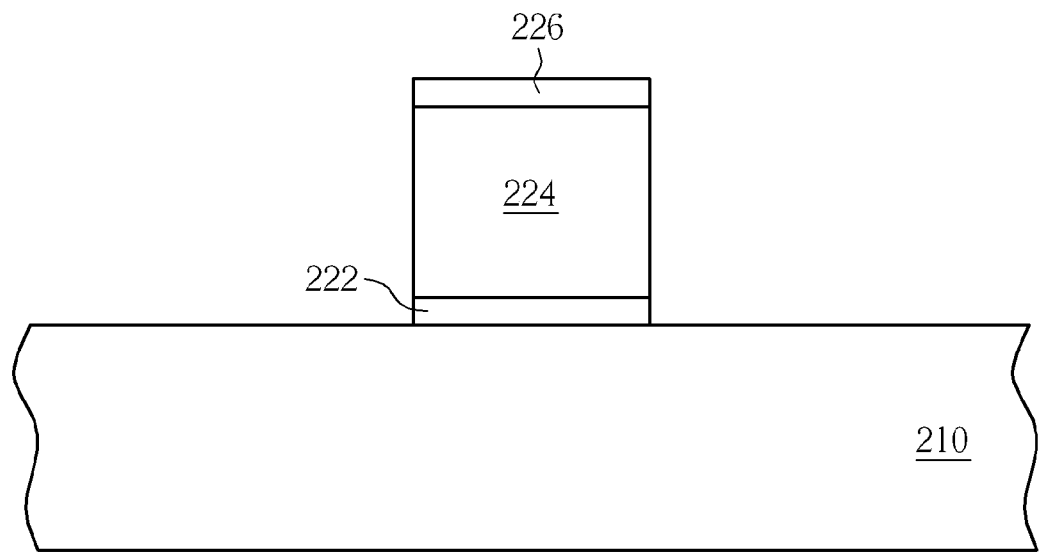
FIGS. 2-9 schematically depict cross-sectional views of a transistor process according to one embodiment of the present invention.

FIGS. 2-9 schematically depict cross-sectional views of a transistor process according to one embodiment of the present invention. As shown in FIG. 2, a substrate 210 is provided. The substrate 210 may be a semiconductor substrate such as a silicon substrate, a silicon containing substrate, a III-V group-on-silicon (such as GaN-on-silicon) substrate, a graphene-on-silicon substrate or a silicon-on-insulator (SOI) substrate. A sacrificial oxide layer (not shown) is formed on the substrate 210. A sacrificial gate (not shown) is formed on the sacrificial oxide layer (not shown). A cap layer (not shown) is formed on the sacrificial gate (not shown). The cap layer (not shown), the sacrificial gate (not shown) and the sacrificial oxide layer (not shown) are patterned to form a gate structure, which includes a sacrificial oxide layer 222 on the substrate 210, a sacrificial gate 224 on the sacrificial oxide layer 222 and a cap layer 226 on the sacrificial gate 224. The sacrificial oxide layer 222 may be formed by an in-situ steam generation (ISSG) process; the sacrificial gate 224 may be a poly-silicon gate; the cap layer 226 may be a silicon nitride layer, but it is not limited thereto.

Figure 3:
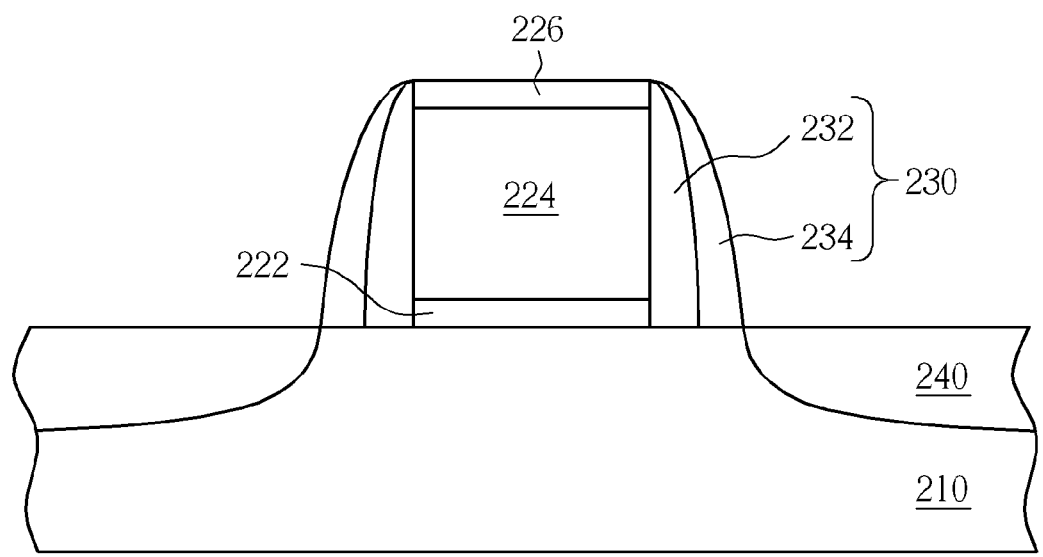

As shown in FIG. 3, a dual spacer 230 is formed beside the sacrificial oxide layer 222, the sacrificial gate 224 and the cap layer 226. The dual spacer 230 may include an inner spacer 232 and an outer spacer 234 to respectively define the locations of a source/drain region and a lightly doped source/drain region. However, in other embodiments, a single spacer or multilayer spacers may be formed. A source/drain region 240 is formed in the substrate 210 beside the spacer 230 by processes such as an ion implantation process. After the source/drain region 240 is formed, a post annealing process, such as a laser spike annealing process may be selectively formed to activate the source/drain region 240.

Figure 4:
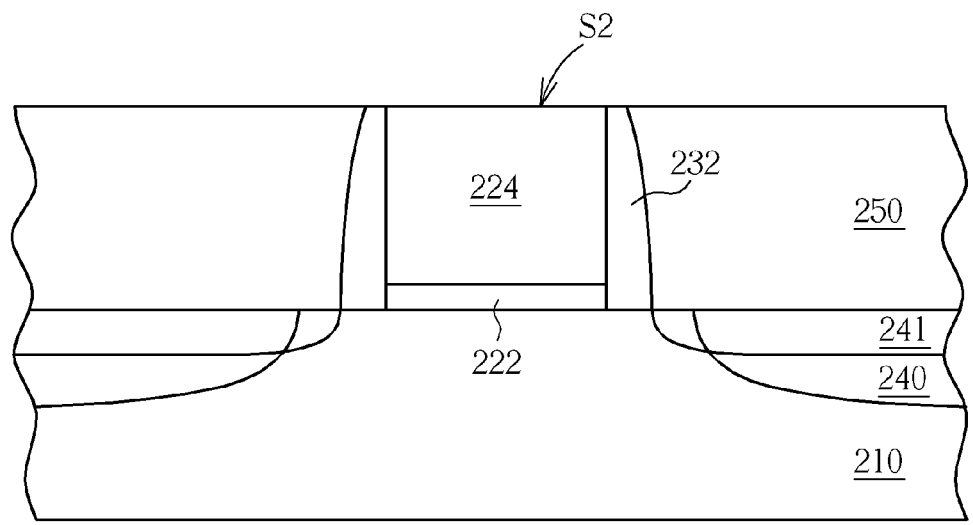

As shown in FIG. 4, the outer spacer 234 is removed so that the inner spacer 232 can be used to define the location of a lightly doped source/drain region, and a lightly doped source/drain region 241 can be formed. A post annealing process may be selectively performed to activate the lightly doped source/drain region 241. In another embodiment, the lightly doped source/drain region 241 may be formed before the source/drain region 240. A salicide process (not shown) may be selectively performed to form a silicide (not shown) on the surface of the source/drain region 240. An interdielectric layer (not shown) is formed to cover the substrate 210, the cap layer 226 and the inner spacer 232. The interdielectric layer (not shown) is planarized by processes such as chemical mechanical polishing (CMP) process. At the same time, the cap layer 226 is removed. Therefore, a planarized interdielectric layer 250 is formed, wherein the top surface of the interdielectric layer 250 is leveled with the top surface S2 of the sacrificial gate 224, but it is not limited thereto.

Figure 5:
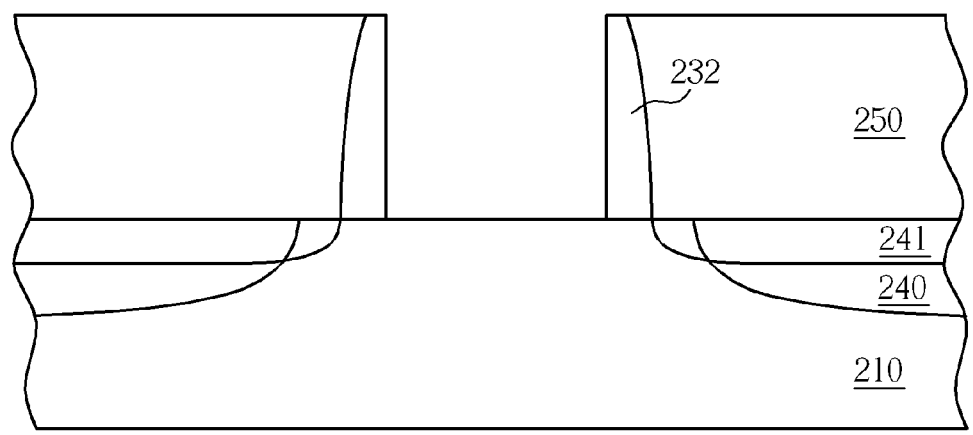

As shown in FIG. 5, the sacrificial gate 224 and the sacrificial oxide layer 222 are sequentially removed to expose the substrate 210. A pre-treatment process (not shown) may be selectively performed. For example, the pre-treatment process (not shown) may be a dilute hydrofluoric acid containing (DHF) pre-treatment process used for cleaning impurities such as native oxides on the exposed substrate 210.

Figure 6:
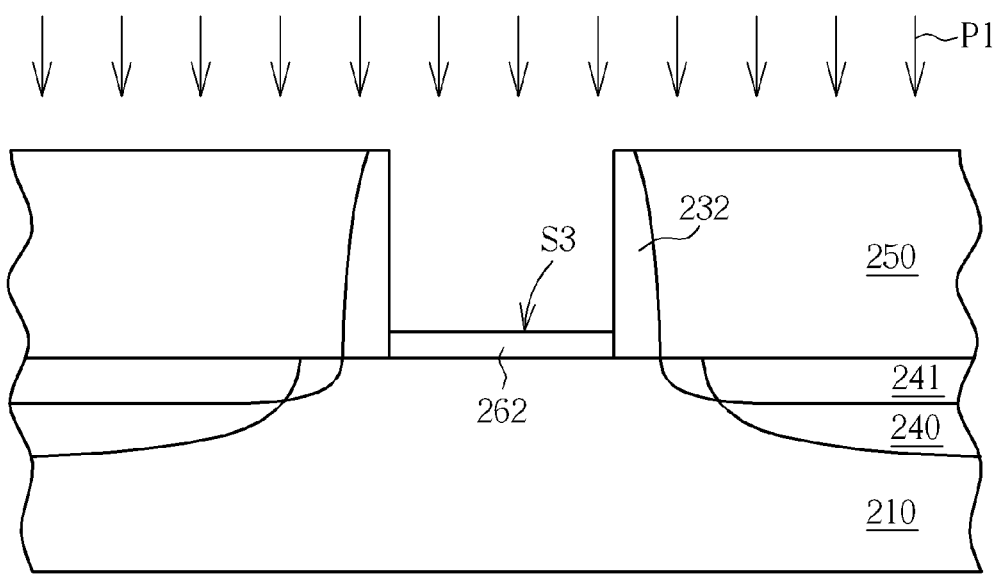

As shown in FIG. 6, an ozone saturated deionized water process P1 is performed to form an oxide layer 262 on the substrate 210. In this embodiment, the oxide layer 262 formed by performing the ozone saturated deionized water process P1 has a "–"-shaped cross-sectional profile, because only the surface of the exposed silicon substrate will be oxidized. In this embodiment, the oxide layer 262 is formed by the ozone saturated deionized water process P1. In another embodiment, the oxide layer may be formed by other chemical oxidation processes. By applying the ozone saturated deionized water process P1, the oxide layer 262 can be thinner, therefore reducing the effective oxide thickness (EOT). After the ozone saturated deionized water process P1 is performed, a standard clean 1 (SC1) process may be selectively performed to clean residues on the surface S3 of the oxide layer 262.

Figure 7:
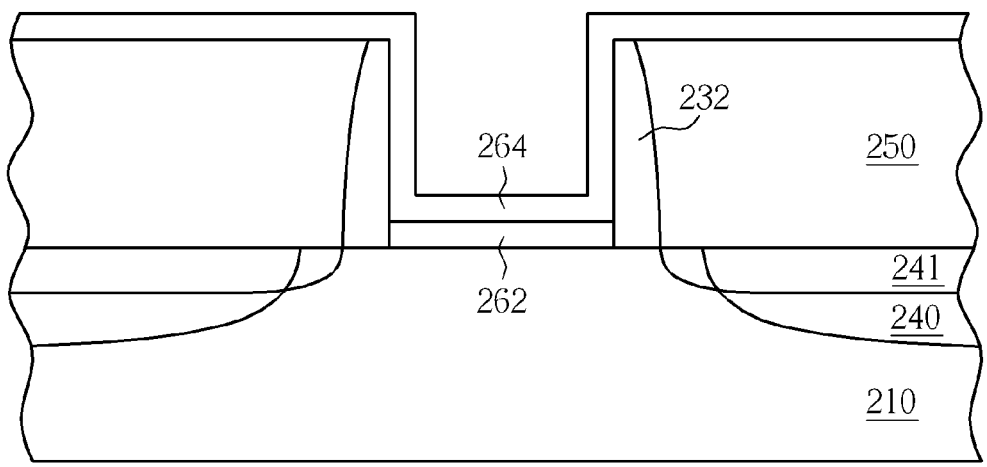

As shown in FIG. 7, a dielectric layer 264 is formed on the oxide layer 262, wherein the dielectric layer 264 in this embodiment has a U-shaped cross-sectional profile. The dielectric layer 264 may be a dielectric layer having a high dielectric constant, which may include hafnium oxide, Zirconium oxide or etc. The dielectric layer having a high dielectric constant may be the group selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalite (SrBi$_2$Ta$_2$O$_9$, SBT), lead zirconate titanate (PbZr$_x$Ti$_{1-x}$O$_3$, PZT) and barium strontium titanate (Ba$_x$Sr$_{1-x}$TiO$_3$, BST).

Figure 8:
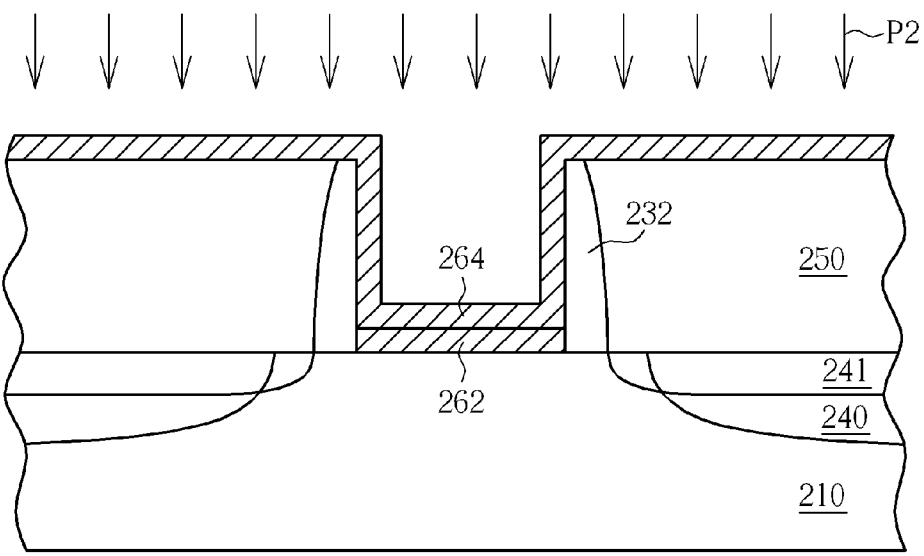

As shown in FIG. 8, a post dielectric annealing (PDA) process P2 is performed on the dielectric layer 264 and the oxide layer 262. The dielectric layer 264 and the oxide layer 262 can be denser and defects in the dielectric layer 264 and the oxide layer 262 can be repaired by performing the post dielectric annealing (PDA) process P2, and silicate such as hafnium silicate (HfSiO$_2$) may be formed between the oxide layer 262 and the dielectric layer 264, thereby reducing the gate leakage (Jg) of the dielectric layer 264 and oxide layer 262.

The post dielectric annealing (PDA) process P2 may include an oxygen annealing process, an ammonia annealing process or a nitrogen annealing process etc. For example, the post dielectric annealing (PDA) process P2 may include performing only an oxygen annealing process, only an ammonia annealing process, or a two-stage process including a nitrogen annealing process after an oxygen annealing process and an ammonia annealing process, but it is not limited thereto. In a preferred embodiment, the post dielectric annealing (PDA) process P2 is an oxygen annealing process. Moreover, the annealing temperature of the post dielectric annealing (PDA) process P2 is preferred to be 600° C.~900° C. Still in a preferred embodiment, the annealing temperature of the post dielectric annealing (PDA) process P2 is preferentially 700° C., so that a formed semiconductor structure can have good electrical curves (of FIG. 10).

Figure 9:
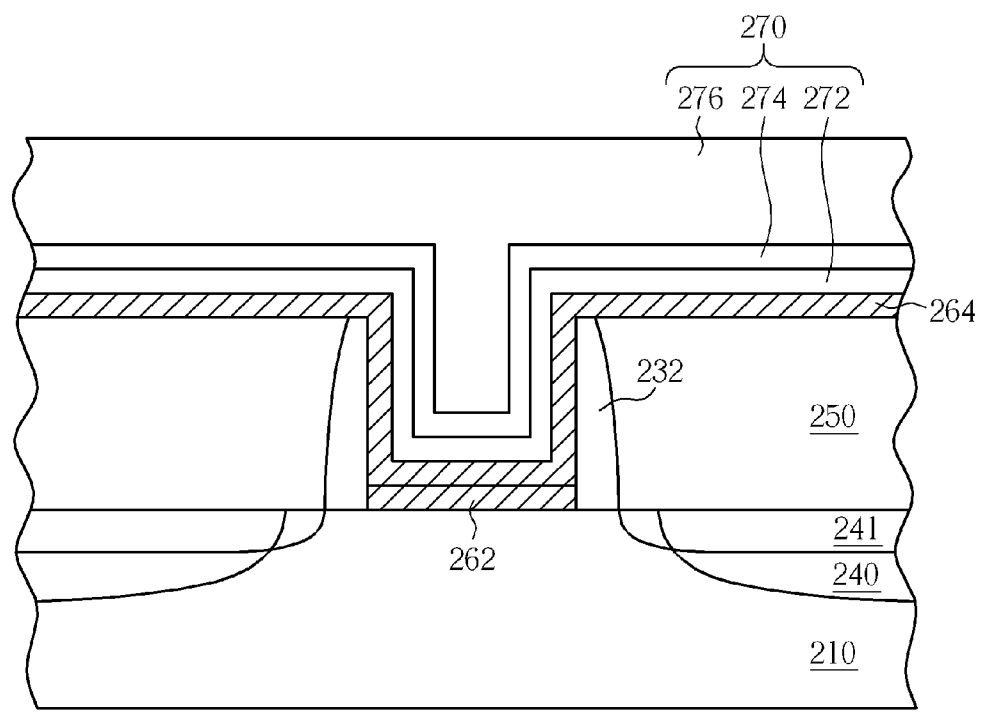

As shown in FIG. 9, after the post dielectric annealing (PDA) process P2 is performed, a metal layer 272 may be formed on the dielectric layer 264. The metal layer 272 may be a barrier layer used to prevent materials above the metal layer 272 from diffusing into the dielectric layer 264 and the oxide layer 262. The metal layer 272 may include a titanium nitride layer, a tantalum nitride layer, combinations of both, etc. In this embodiment, the metal layer 272 is a titanium nitride layer formed by an atomic layer deposition (ALD) process. Therefore, the metal layer 272 has an excellent structure and ultra thin thickness. After the metal layer 272 is formed, a post metal annealing (PMA) process may be selectively performed, wherein the post metal annealing (PMA) process may be an oxygen post metal annealing process, but is not limited thereto. By performing the oxygen post metal annealing process, the work function value of the metal layer 272, the total gate leakage (Jg) of the dielectric layer 264 and the oxide layer 262 can be repaired.

After the metal layer 272 is formed, a work function metal layer 274 is formed on the metal layer 272, and a barrier layer (not shown) and a main electrode 276 are formed on the work function metal layer 274. The work function metal layer 274 may include a titanium nitride layer, an aluminum titanium layer, combinations of both or etc; the main electrode 276 may include a low-resistance conductor such as an aluminum electrode, but is not limited thereto. A planarized process is performed to remove the interdielectric layer 250 above the main electrode 276, the work function metal layer 274, the metal layer 272 and the dielectric layer 264, the metal gate process is then finished.

Above all, the present invention provides a semiconductor process, which cleans a substrate by dulite hydrofluoric acid; performs an ozone saturated deionized water process to form an oxide layer on the substrate; forms a dielectric layer on the oxide layer; and then performs a post dielectric annealing (PDA) process on the dielectric layer and the oxide layer. Therefore, the effective oxide thickness (EOT) and gate leakage (Jg) of the formed dielectric layer and oxide layer can be reduced through performing the ozone saturated deionized water process to form the oxide layer, and performing a post dielectric annealing (PDA) process on the dielectric layer and the oxide layer.

The post dielectric annealing (PDA) process P2 may include an oxygen annealing process, an ammonia annealing process or a nitrogen annealing process etc. For example, the post dielectric annealing (PDA) process P2 may include only an oxygen annealing process, only an ammonia annealing process, or a two-stage process comprising a nitrogen annealing process after an oxygen annealing process and an ammonia annealing process. In a preferred embodiment, the post dielectric annealing (PDA) process P2 is an oxygen annealing process. Furthermore, the annealing temperature of the post dielectric annealing (PDA) process P2 is preferred to be 600° C.~900° C. Still in a preferred embodiment, the annealing temperature of the post dielectric annealing (PDA) process P2 is 700° C., so that a formed semiconductor structure can have good electrical curves.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor process, comprising:
   providing a substrate;
   performing an ozone saturated deionized water process once to form a single oxide layer on the substrate;
   forming a dielectric layer directly on the single oxide layer; and
   simultaneously performing a post dielectric annealing (PDA) process comprising an oxygen-rich annealing process on the dielectric layer and the single oxide layer immediately after the dielectric layer is formed, wherein the annealing temperature of the post dielectric annealing (PDA) process is 600° C.~900° C.

2. The semiconductor process according to claim 1, further comprising:
   performing a pre-treatment process before the ozone saturated deionized water process is performed.

3. The semiconductor process according to claim 2, wherein the pre-treatment process comprises a dilute hydrofluoric acid containing (DHF) pre-treatment process.

4. The semiconductor process according to claim 1, wherein the dielectric layer comprises a dielectric layer having a high dielectric constant.

5. The semiconductor process according to claim 1, wherein the annealing temperature of the post dielectric annealing (PDA) process is 700° C.

6. The semiconductor process according to claim 1, further comprising:
   performing a standard clean 1 (SC1) process after the ozone saturated deionized water process is performed.

7. The semiconductor process according to claim 1, further comprising:
   forming a metal layer after the post dielectric annealing (PDA) process is performed.

8. The semiconductor process according to claim 7, wherein the metal layer comprises a titanium nitride layer.

9. The semiconductor process according to claim 8, wherein the titanium nitride layer comprises being formed by an atomic layer deposition (ALD) process.

10. The semiconductor process according to claim 7, further comprising:
    performing a post metal annealing (PMA) process after the metal layer is formed.

11. The semiconductor process according to claim 10, wherein the post metal annealing (PMA) process comprises an oxygen post metal annealing process.

12. The semiconductor process according to claim 1, further comprising:
   forming a sacrificial oxide layer on the substrate before the ozone saturated deionized water process is performed; and
   removing the sacrificial oxide layer.

13. The semiconductor process according to claim 12, wherein the sacrificial oxide layer comprises being formed by an in-situ steam generation (ISSG) process.

14. The semiconductor process according to claim 12, further comprising:
   forming a sacrificial gate on the sacrificial oxide layer after the sacrificial oxide layer is formed;
   patterning the sacrificial gate and the sacrificial oxide layer;
   forming a spacer beside the sacrificial gate and the sacrificial oxide layer;
   forming a source/drain region in the substrate beside the spacer; and
   removing the sacrificial gate.

15. The semiconductor process according to claim 1, wherein the post dielectric annealing (PDA) process comprising an oxygen-rich annealing process is performed on the dielectric layer and the oxide layer to form a silicate between the oxide layer and the dielectric layer.

\* \* \* \* \*